US010032633B1

(12) United States Patent
Chen et al.

(10) Patent No.: US 10,032,633 B1
(45) Date of Patent: Jul. 24, 2018

(54) IMAGE TRANSFER USING EUV LITHOGRAPHIC STRUCTURE AND DOUBLE PATTERNING PROCESS

(71) Applicant: INTERNATIONAL BUSINESS MACHINES CORPORATION, Armonk, NY (US)

(72) Inventors: Hsueh-Chung Chen, Cohoes, NY (US); Yann A. M. Mignot, Slingerlands, NY (US); Yongan Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/407,539

(22) Filed: Jan. 17, 2017

(51) Int. Cl.
| | |
|---|---|
| *G03F 7/11* | (2006.01) |
| *G03F 7/115* | (2006.01) |
| *H01L 21/033* | (2006.01) |
| *H01L 21/02* | (2006.01) |
| *G03F 7/30* | (2006.01) |
| *G03F 7/20* | (2006.01) |
| *H01L 21/027* | (2006.01) |
| *G03F 7/16* | (2006.01) |

(52) U.S. Cl.
CPC .......... *H01L 21/0338* (2013.01); *G03F 7/11* (2013.01); *G03F 7/115* (2013.01); *G03F 7/16* (2013.01); *G03F 7/2004* (2013.01); *G03F 7/30* (2013.01); *H01L 21/0274* (2013.01); *H01L 21/0332* (2013.01); *H01L 21/0335* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 5,091,282 A * | 2/1992 | Onishi | ................ G03F 7/0045 430/270.1 |
| 6,440,640 B1 | 8/2002 | Yang et al. | |
| 6,653,054 B2 | 11/2003 | Schiltz | |
| 6,720,249 B1 * | 4/2004 | Dalton | ............. H01L 21/76802 257/E21.579 |
| 7,244,549 B2 | 7/2007 | Iwasawa et al. | |
| (Continued) | | | |

OTHER PUBLICATIONS

Hsueh-Chung Chen, et al., Pending U.S. Appl. No. 15/798,659 entitled "Image Transfer Using EUV Lithographic Structure and Double Patterning Process," filed Oct. 31, 2017.

(Continued)

*Primary Examiner* — Martin J Angebranndt
(74) *Attorney, Agent, or Firm* — Cantor Colburn LLP

(57) ABSTRACT

An EUV lithographic structure includes an EUV photosensitive resist layer disposed on a hardmask layer, wherein the EUV lithographic structure is free of an antireflective coating. An organic adhesion layer can be provided between the hardmask layer and the EUV photosensitive resist layer. The hardmask layer can include an uppermost oxide hardmask layer, an intermediate hardmask layer, and a lowermost oxide hardmask layer, wherein the EUV photosensitive resist layer is disposed on the uppermost oxide hardmask layer. Also described are methods for patterning the EUV lithographic structures.

4 Claims, 4 Drawing Sheets

(56) References Cited

U.S. PATENT DOCUMENTS

| | | | |
|---|---|---|---|
| 7,803,715 B1* | 9/2010 | Haimson | H01L 21/02115 257/E21.058 |
| 8,658,050 B2 | 2/2014 | Engelmann et al. | |
| 8,883,374 B2* | 11/2014 | Altamirano Sanchez | G03F 1/20 430/323 |
| 8,940,641 B1 | 1/2015 | Hu et al. | |
| 9,093,279 B2 | 7/2015 | Nakajima et al. | |
| 9,123,776 B2 | 9/2015 | Tsai et al. | |
| 9,140,987 B2 | 9/2015 | Chien et al. | |
| 9,219,007 B2 | 12/2015 | Chen et al. | |
| 9,768,065 B1* | 9/2017 | Wang | H01L 21/76886 |
| 2008/0020584 A1* | 1/2008 | Hirotsu | H01L 21/31116 438/725 |
| 2013/0270709 A1* | 10/2013 | Tseng | H01L 21/0337 257/774 |
| 2014/0097520 A1* | 4/2014 | Millward | H01L 21/76816 257/622 |
| 2014/0199628 A1* | 7/2014 | Edelstein et al. | G03F 7/094 430/270.1 |
| 2014/0273496 A1* | 9/2014 | Kao | H01L 21/31144 438/743 |
| 2014/0342030 A1* | 11/2014 | Nakatsuka | B29C 33/56 425/385 |
| 2015/0168843 A1* | 6/2015 | Cooper | H01L 21/31133 510/176 |
| 2015/0235951 A1* | 8/2015 | Choi | H01L 23/5329 257/639 |
| 2015/0340246 A1* | 11/2015 | Woo | H01L 21/32139 438/703 |

OTHER PUBLICATIONS

List of IBM Patents or Patent Applications Treated As Related; (Appendix P), Date Filed Oct. 31, 2017; 2 pages.

* cited by examiner

IMAGE TRANSFER USING EUV LITHOGRAPHIC STRUCTURE AND DOUBLE PATTERNING PROCESS

BACKGROUND

The present invention generally relates to semiconductor integrated circuits, and more particularly, to image transfer processes employing an extreme ultraviolet (EUV) sensitive lithographic structure and double patterning process.

The back-end-of-line (BEOL) is the second portion of integrated circuit fabrication where the individual devices (transistors, capacitors, resistors, etc.) are interconnected with interconnects and a metallization layer, which function as the wiring network of the wafer. Common metals that are used to form the metallization layers and interconnects are copper and aluminum. BEOL generally begins when the first layer of metal (M1) is deposited on the wafer. BEOL includes contacts, insulating layers (dielectrics), metal levels, and bonding sites for chip-to-package connections. Double patterning processes such as self-aligned double patterning (SADP) or litho-etch-litho etch (LELE) are typically part of the BEOL process for advanced design rules.

Patterning at 10 nm and sub-10 nm technology nodes is a challenge for the semiconductor industry. Several patterning techniques are under investigation to enable the aggressive pitch requirements at these technology nodes. EUV lithography based patterning is being considered as a serious candidate for the sub-10 nm nodes.

SUMMARY

Described herein are methods and EUV lithographic structures. In one or more embodiments of the invention, the method includes forming an organic planarizing layer over a semiconductor substrate, the organic planarizing layer including a planar upper surface. A hardmask layer is formed on the planar upper surface of the organic planarizing layer. An organic adhesion layer is formed on the hardmask layer. An EUV photosensitive resist layer is formed on the organic adhesion layer, wherein the EUV photosensitive resist layer is exposed with an EUV light source and developed to form an opening therein. The opening in the EUV photosensitive resist layer is transferred to the hardmask layer by, for example, reactive ion etching. The opening is extended into the organic planarizing layer and to the substrate by, for example, reactive ion etching.

In one or more embodiments of the invention, the method includes forming an organic planarizing layer over topography formed on a semiconductor substrate, the organic planarizing layer including a planar upper surface. A multilayer hardmask layer is formed on the planar upper surface of the organic planarizing layer. The multilayer hardmask layer includes an uppermost oxide hardmask layer, an intermediate hardmask layer, and a lowermost oxide hardmask layer. An organic adhesion layer is formed on the uppermost oxide hardmask layer. An EUV photosensitive resist layer is formed on the organic adhesion layer. The EUV photosensitive resist layer is exposed with an EUV light source and developed to form an opening therein. The opening in the EUV sensitive photoresist layer is transferred to the uppermost hardmask layer by reactive ion etching. An additional EUV photosensitive resist layer is formed on the uppermost hardmask layer. The EUV photosensitive resist layer is exposed with an EUV light source and developed to form an additional opening therein. The opening and the additional opening are extended into the intermediate hardmask layer and to the lowermost hardmask layer by, for example, reactive ion etching. The intermediate hardmask layer is removed. The opening and the additional opening are extended into the lowermost oxide hardmask layer and the organic planarizing layer by, for example, reactive ion etching within the same etch chamber.

An EUV lithographic structure consists of an EUV photosensitive resist layer, an organic adhesive layer, and a multilayer hardmask layer. The multilayer hardmask layer includes an uppermost oxide hardmask layer, an intermediate hardmask layer, and a lowermost oxide hardmask layer. The EUV lithographic structure is free of an antireflective layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
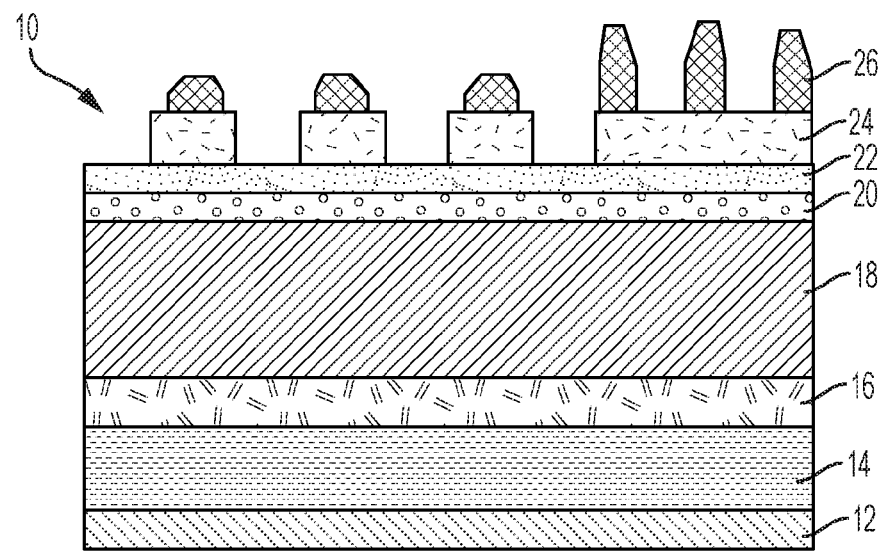
FIG. 1 depicts a cross section of a semiconductor structure at an intermediate stage of manufacturing following a hardmask open to expose topographical features formed on a substrate.

A multi-layer EUV lithographic structure and process for lithographic via patterning generally according to embodiments of the present invention includes an EUV photosensitive resist layer disposed on a multilayer hardmask layer for patterning critical layers of advanced integrated circuits. A relatively thin organic adhesive layer such as polystyrene can be provided to provide increased adhesion of the EUV photosensitive resist layer to the multilayer hardmask layer. The multilayer hardmask layer includes an intermediate hardmask layer between uppermost and lowermost oxide hardmask layers. The intermediate hardmask layer can be titanium nitride or an organosilicon such as octylmethylcyclotetrasiloxane. As will be discussed in greater detail herein, the multilayer EUV lithographic structure and process for via lithographic patterning markedly reduces costs because, unlike trilayer patterning schemes, an antireflective layer is not utilized. That is, the EUV photosensitive resist is deposited onto the uppermost hardmask layer for the lithography step, which can be a low temperature oxide, for example. The lowermost hardmask layer, which can also be a low temperature oxide layer, is configured to provide effective adhesion of the nitride intermediate hardmask layer so as to prevent delamination. Still further, multiple patterning of the same uppermost oxide hardmask layer can be used with the inventive EUV lithographic structure, thereby providing greater versatility. Patterning techniques employing the EUV lithographic structures include double patterning techniques such as, for example, a lithographic-etch sequence (LELE or LELELE). Alternative double patterning techniques can include sidewall image transfer process or self-aligned double patterning techniques.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

Referring now to FIG. 1, there is shown a cross sectional view of an exemplary semiconductor structure 10 at an intermediate stage of manufacturing for advanced design rules subsequent to hard mask open of a metal layer 24 formed on a substrate 12. As will be readily apparent to those skilled in the art, the present EUV lithographic structure and process for lithographic patterning is applicable to a variety of technologies, e.g., NMOS, PMOS, CMOS, etc., and is readily applicable to a variety of devices, including, but not limited to, ASIC's, logic devices, memory devices, and the like.

The substrate 12 can include any semiconducting material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. Typically, the semiconductor substrate is a Si-containing semiconductor such as, for example, Si, SiC, SiGe, SiGeC, or a silicon-on-insulator. The substrate can be unstrained, strained or include regions of strain and unstrain therein. The substrate can be intrinsic or it can be doped with, for example, but not limited to boron, arsenic or phosphorous When SOI substrates are employed, those substrates include a top semiconductor layer and a bottom semiconductor layer that are separated at least in part by a buried insulating layer. The buried insulating layer includes, for example, a crystalline or non-crystalline oxide, nitride or any combination thereof. In one or more embodiments, the buried insulating layer is an oxide. Typically, the buried insulating layer is formed during initial stages of a layer transfer process or during an ion implantation and annealing process, such as, for example, SIMOX (separation by ion implantation of oxygen).

The exemplary semiconductor structure 10 at the intermediate stage of manufacturing can include various layers formed on the substrate 12. For example, the various layers can include any dielectric materials suitable for BEOL or MOL interconnect structures. In one or more embodiments, the various layers can include any gate materials suitable for FEOL structures. In other embodiments, the various layers can include can be a semiconductor material or a dielectric material on top of a semiconductor material.

The various layers are not intended to be limited to any particular number or type and will generally depend on the devices being manufactured. By way of example, the exemplary semiconductor structure 10 can includes layers 14, 16, 18, 20 and 22 upon which there are topographical features. The various layers can include dielectric layers, masking layers, antireflective layers and the like. For example, layer 14 can be a tetraorthosilicate layer as a precursor to silicon dioxide; layer 16 can be a NBlok (SiC$_x$N$_y$H$_z$) layer; layer 18 can be an ultralow k organic planarizing layer; layer 20 can be an organosilicon such as octylmethylcyclotetrasiloxane; and layer 22 can be tetraorthosilicate. The various layers can be deposited by chemical vapor deposition (CVD), plasma enhanced chemical vapor deposition (PECVD), low pressure chemical vapor deposition (LPCVD), atmospheric deposition as well as spin on techniques.

By way of example, layer 14 can be formed of tetraorthosilicate at a thickness of about 4000 to 6000 Angstroms; layer 16 can be formed of can be a NBlok ($SiC_xN_yH_z$) layer at a thickness of about 100 to 300 Angstroms; layer 18 can be formed of an ultralow k dielectric at a thickness of about 500 to 1000 Angstroms; layer 20 can be formed of octylmethylcyclotetrasiloxane at a thickness of about 10 to 200 Angstroms; and layer 22 can be formed of tetraorthosilicate at a thickness of about 50 to 200 Angstroms.

The exemplary semiconductor structure 10 further includes topographical features 26 formed on the hard mask metal layer 24 such as titanium nitride. The topographical features 26 can be formed of an oxide layer deposited on the hardmask 24 using known patterning techniques, e.g., sidewall image transfer or the like. By way of example, layer 24 can be titanium nitride at a thickness of about 100 to 400 Angstroms, and layer 26 from which the features are patterned therefrom can be a low temperature oxide at a thickness of about 500 to 1000 Angstroms.

Figure 2:
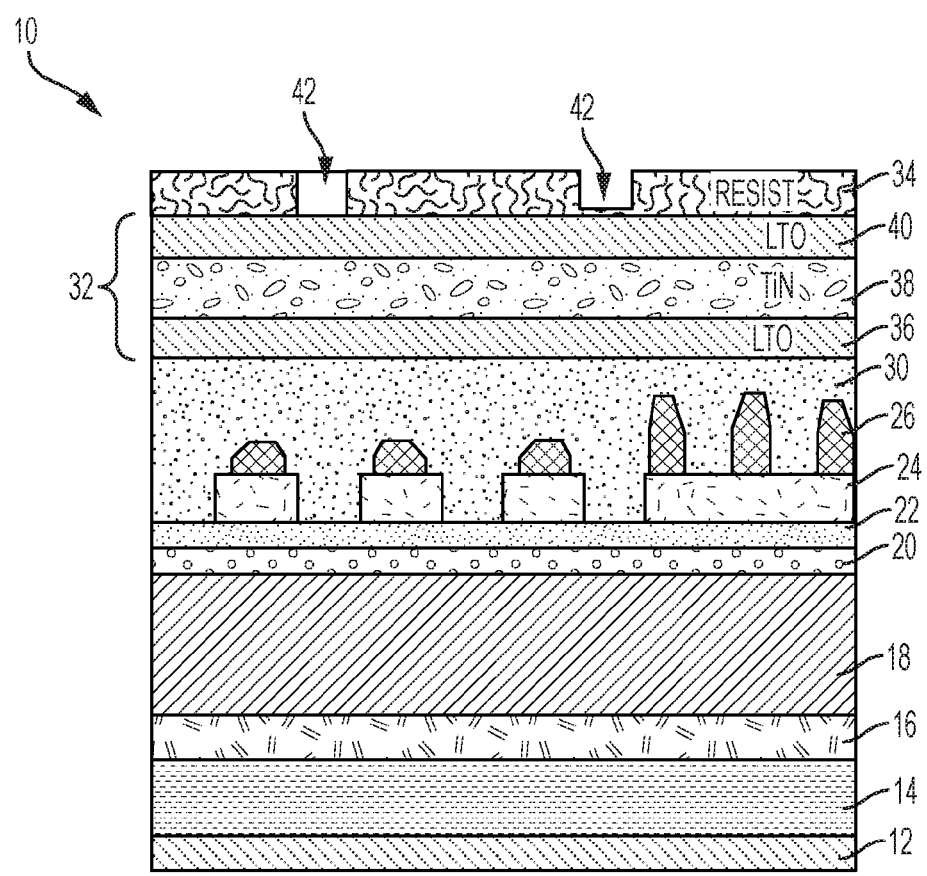
FIG. 2 depicts a cross section of the semiconductor structure of FIG. 1 following deposition and patterning of EUV photosensitive resist layer of an EUV lithographic structure in accordance with one or more embodiments of the invention.

Referring now to FIG. 2, an organic planarizing layer 30 is deposited over the topographical features 26 and selected to form a planar upper surface after which an EUV lithographic structure in accordance with the present invention is formed thereon.

The organic planarization layer 30 can be a polymer including carbon, hydrogen, oxygen, and optionally nitrogen, fluorine, and silicon. In one or more embodiments, the planarization layer 30 is a polymer with sufficiently low viscosity so that the top surface of the applied polymer forms a planar top surface. In one or more other embodiments, the organic planarizing layer is a layer of material capable of being planarized by known chemical mechanical planarization processes. The organic planarization layer, which can be a spin-deposited layer, can be baked at an elevated temperature to cure the planarization layer, if needed, and reflow its top surface into a substantially planar form. The thickness of the planarization layer can be about 50 nanometers to about 300 nanometers (nm), although lesser and greater thicknesses can also be employed.

The EUV lithographic structure includes an EUV photosensitive resist layer 34 deposited onto a multilayer hardmask 32. In one or more embodiments, a relatively thin organic adhesive layer such as polystyrene can be provided to provide increased adhesion of the EUV photosensitive resist layer to the multilayer hardmask. Advantageously, an antireflective layer is not included and is not a needed for EUV imaging of the EUV photosensitive resist layer 34 of the EUV lithographic structure. The EUV photosensitive resist layer 34 is not intended to be limited and can be a chemically amplified photoresist or a non-chemically amplified photoresist, e.g., inorganic or semi-inorganic, as is known in art. The thickness of the EUV photosensitive layer 34 will generally depend on the properties thereof and generally range from about 10 nm to about 100 nm. In one or more embodiments, a thin organic adhesion layer (not shown) of about a few nanometers could be added between layer 34 and layer 40. By way of example, the thickness of the organic adhesion layer can be about 5 nm to about 10 nm. For some EUV photosensitive layers, the organic adhesion layer can prevent tight pitch structure collapse or line flop over. The thin organic adhesion layer can be an organic polymer material, such as polystyrene (PS) for example.

In EUV lithography (EUVL) a high energy laser beam is used to vaporize a target material to produce a plasma which in turn, produces radiation of a characteristic wavelength. The composition of the target material generally determines the wavelength of the radiation produced. For 13 nm radiation, gold is the preferred target material although other target materials such as copper, tantalum, tungsten and tin can be used. Alternatively, a synchrotron radiation source could be employed as the EUV source. The radiation is transmitted by a series of reflective mirrors to a mask. Due to high absorption at EUV wavelengths, a vacuum environment is typically required. The EUV photosensitive resist layer is exposed to the EUV radiation source and developed to form a relief pattern.

The multilayer hardmask 32 is formed on a planar top surface of an organic planarizing layer 30, and as noted above, generally includes a lowermost hardmask layer 36 formed on the organic planarizing layer 30, an intermediate hardmask layer 38 on the lowermost hardmask layer 36, and an uppermost hardmask layer 40 on the intermediate hardmask layer 38.

The lowermost and uppermost hard mask layers 36, 40, respectively, are not intended to be limited and can be a silicon oxide, amorphous carbon, silicon oxynitride, e.g., self-aligned contact (SAC) nitride, tertraorthosilicate (TEOS) or the like. The lowermost and uppermost hard mask layers 36, 40, respectively, can be the same material or different materials. In one or more embodiments, the lowermost and uppermost hard mask layers 36, 40, respectively, can be a low temperature oxide carried out by LPCVD, PECVD using the following tool model "iRAD" commercially available from Tokyo Electron Limited (TEL), or the like. The process of forming the low temperature oxides generally includes reaction of silane gas with oxygen to form a silicon dioxide layer as is known in the art. With respect to the lowermost hardmask layer 36, the silicon oxide, amorphous carbon or the like provides effective adhesion of the intermediate hardmask layer 38 to the underlying organic planarizing layer 30, thereby preventing delamination. The lowermost and uppermost hard mask layers 36, 40, respectively, can have a thickness ranging from 5 nanometers (nm) to 40 nm.

The intermediate hardmask layer 38 can be titanium nitride and can have a thickness ranging from 10 nanometers (nm) to 70 nm. Alternatively, the intermediate hardmask layer 38 is an organosilicon such as octylmethylcyclotetrasiloxane.

FIG. 2 illustrates the resultant structure subsequent to lithographic formation of vias 42 in the EUV photosensitive resist layer 34, which begins with the exposure and development of the photosensitive EUV photosensitive resist layer 34 utilizing a mask having a desired pattern to be formed in the EUV photosensitive resist layer 34.

Figure 3:
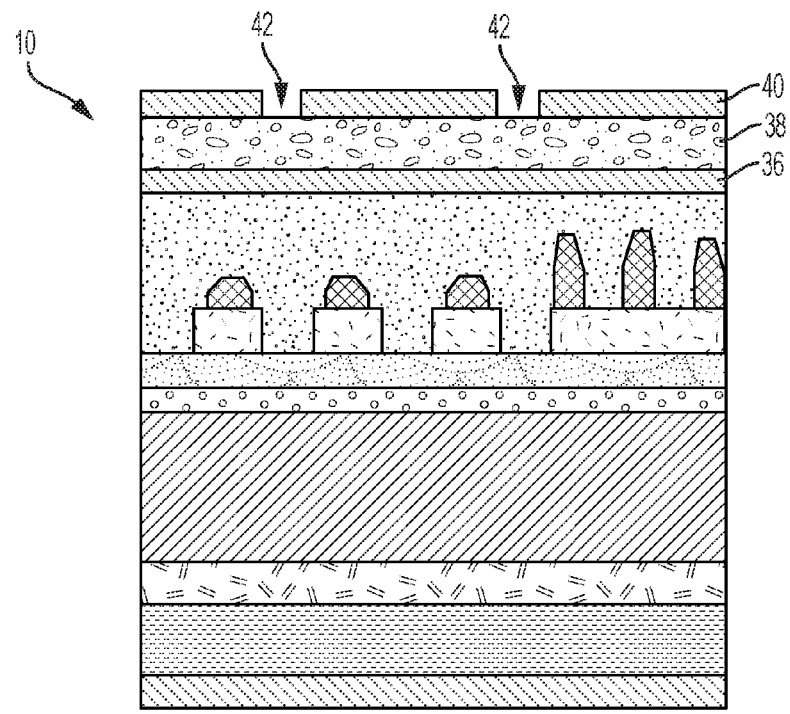
FIG. 3 depicts a cross section of the semiconductor structure of FIG. 2 following transfer of openings formed in the patterned EUV photosensitive resist layer into an uppermost oxide hardmask layer of a multilayer hardmask.

In FIG. 3, the pattern of vias 42 within the EUV photosensitive resist layer is transferred into the uppermost hardmask layer 40 so as to selectively open the intermediate hardmask layer 38 by a directional dry etching process including, for example, reactive ion etching, ion beam etching, plasma etching or laser ablation, or the like. A portion of the EUV photosensitive resist layer 34 can also be removed during the etching process. The remaining portion of the EUV photosensitive resist layer 34 can be removed by an ashing process or wet cleaning step as is generally known in the art. By way of example, the uppermost hardmask layer 40 can be a low temperature oxide and subjected to the reactive ion etching process using, for example, a fluorocarbon based etchant.

Figure 4:
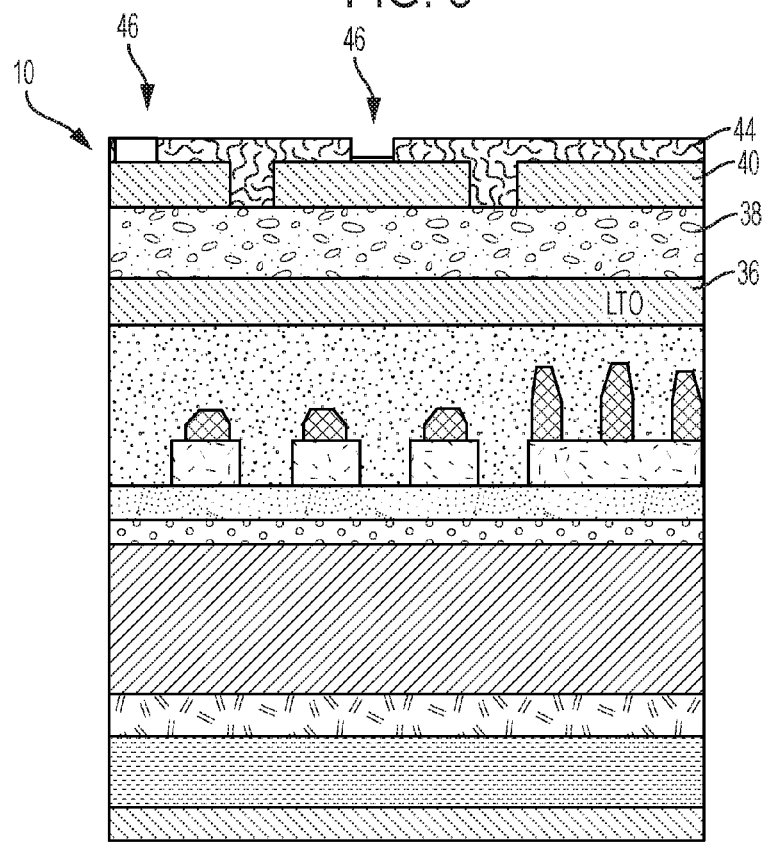
FIG. 4 depicts a cross section of the semiconductor structure of FIG. 3 following deposition and patterning of an additional EUV photosensitive resist layer on the uppermost oxide hardmask layer.

FIG. 4 illustrates the resulting structure following deposition of an additional EUV resist layer 44 onto the patterned uppermost hardmask layer 40. The deposition of the additional EUV photosensitive resist layer 44 is optional and can be subsequently imaged utilizing an additional mask and developed to form a second pattern of vias 46. As such, the EUV lithographic structure and process permits multiple patterning schemes of the same uppermost hardmask layer 40 using different masks for different critical dimensions as can be desired for some applications. In one or more embodiments, the organic adhesion layer can be deposited prior to deposition of the additional EUV photosensitive layer.

Figure 5:
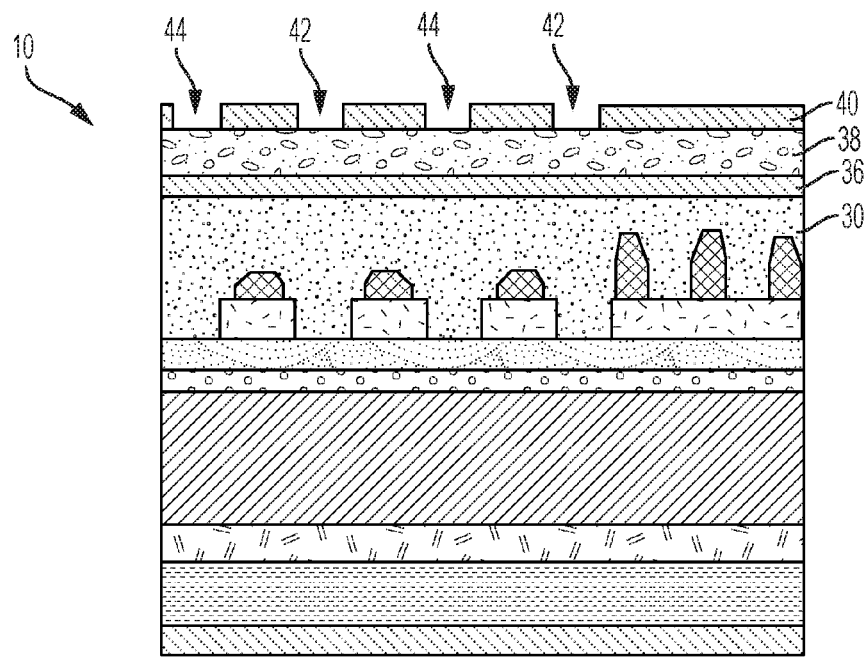
FIG. 5 depicts a cross section of the semiconductor structure of FIG. 4 following transfer of additional openings formed in the additional patterned EUV photosensitive resist layer into an uppermost oxide hardmask layer of the multilayer hardmask.

FIG. 5 illustrates the resulting structure subsequent to the transfer of the additional via pattern 44 formed in the additional EUV photosensitive resist layer into the uppermost hardmask layer 40 by a directional dry etch process such as a reactive etching process so as to open the underlying intermediate hardmask layer 38. As a result, the uppermost hardmask layer 40 of the resulting structure includes vias 42 and 44 formed therein. The vias 42, 44 can be of the same or of a different critical dimension.

Figure 6:
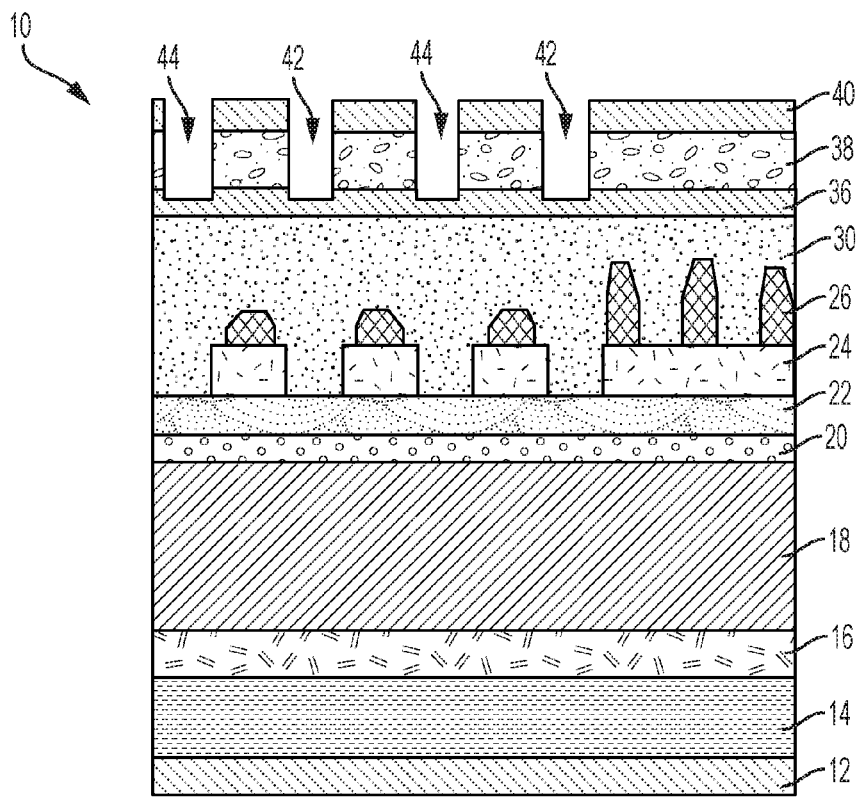
FIG. 6 depicts a cross section of the semiconductor substrate of FIG. 5 following transfer of the openings in the uppermost oxide hardmask layer to an intermediate nitride hardmask layer of the multilayer hardmask.

In FIG. 6, the opened intermediate hardmask layer 38 is anisotropically etched using, for example, a dry etch process to the lowermost hardmask layer 36 by an etch process. For example, when the intermediate hardmask layer 38 is titanium nitride, the layer can be etched using a chlorine based chemistry with additives such as methane, argon, and/or nitrogen gas to control the process. The intermediate hardmask layer 38 is etched to the lowermost hardmask layer 36.

Figure 7:
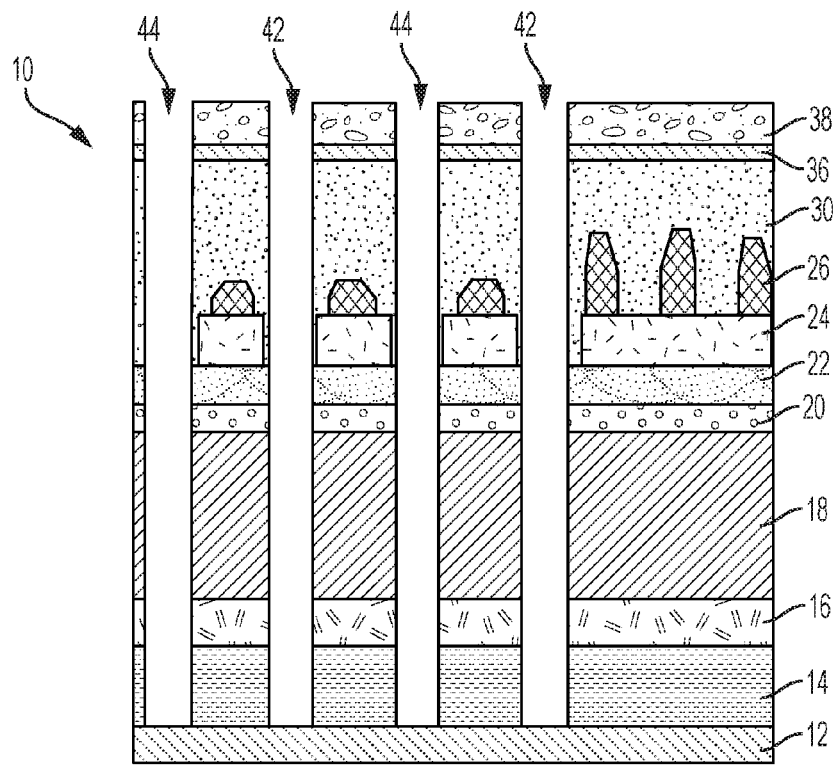
FIG. 7 depicts a cross section of the semiconductor substrate of FIG. 6 following transfer of the openings in the intermediate nitride hardmask layer to layers underlying the multilayer hardmask in accordance with one or more embodiments of the invention.

FIG. 7 illustrates the resultant structure in accordance with one or more embodiments wherein the memory pattern in the intermediate hardmask layer 38 is further transferred to the substrate using a dry etch process such as reactive ion etch. The etch chemistry can be varied within the same chamber to directionally etch though the various dielectric underlayers 14, 16, 18, 20, 22 and 30 to the substrate. In one or more embodiments, the vias have a critical dimension of about 14 nanometers and the organic planarizing layer has a thickness of about 60 to about 100 nanometers, which results in a relatively high aspect ratio.

Figure 8:
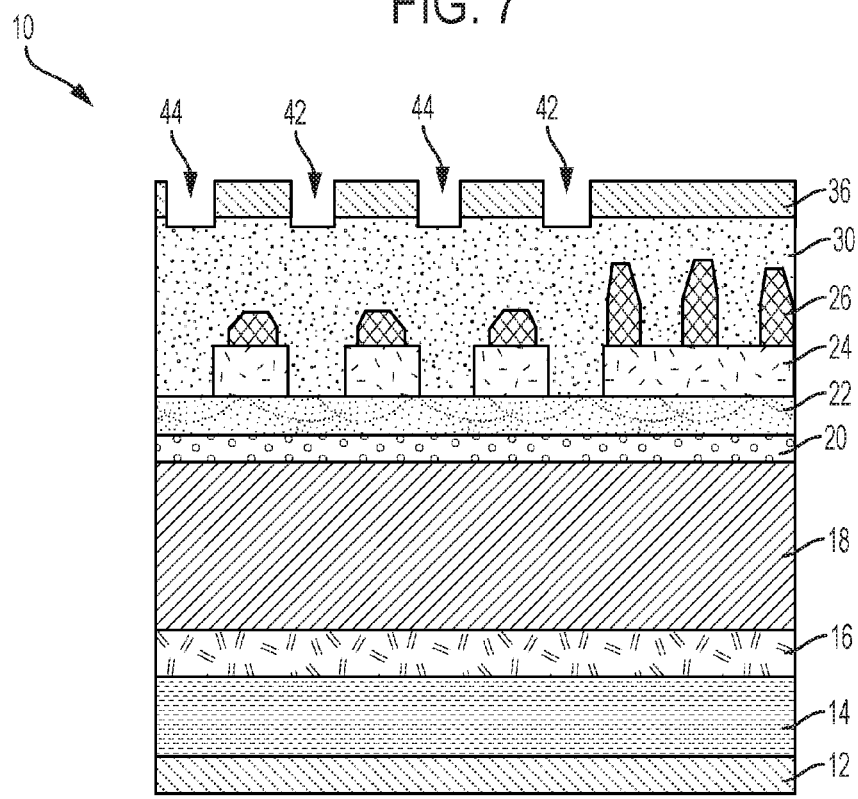
FIG. 8 depicts a cross section of the semiconductor substrate of FIG. 7 following removal of the intermediate nitride hardmask layer prior to transfer of the openings in the intermediate nitride hardmask layer to layers underlying the multilayer hardmask in accordance with one or more embodiments of the invention.

In one or more alternative embodiments shown in FIG. 8, the intermediate hardmask layer 38 is first removed. Removal can be effected by wet or dry etching. An exemplary wet etch is a standard clean wet etching process referred to by those skilled in the art as SC-1, which utilizes an aqueous solution including ammonium hydroxide, hydrogen peroxide, and water, which is typically removed for metallic contamination. removal. The ratio of $NH_4OH$:$H_2O_2$:$H_2O$ is typically 1:2:10, respectively. Advantageously, the wet strippability of the nitride layer in the SC-1 wet etchant does so without damaging the underlayers e.g., the lowermost hardmask layer 36 and without the need for a dry etch process.

The substrate can be exposed to the wet etchant for a period of time (typically, about 0.5 minutes to about 30 minutes) and at a temperature (about 25° C. to about 70° C.) effective to etch the titanium nitride selectively relative to the surrounding structures.

Subsequent to removal of the intermediate hardmask layer 38, the structure can be subjected to a dielectric etch within the same etch chamber to selectively remove one or more of the underlayers to provide vias to the one or more layers or to the substrate.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. An EUV lithographic structure comprising:
   an EUV photosensitive resist layer; and
   a multilayer hardmask layer comprising an uppermost oxide hardmask layer, an intermediate hardmask layer, and a lowermost oxide hardmask layer provided upon a substrate, wherein the EUV lithographic structure is free of an antireflective layer and the EUV photosensitive resist layer is deposited on and in direct contact with the multilayer hardmask layer.

2. The EUV lithographic structure of claim 1, wherein the uppermost and lowermost oxide hardmask layers comprise a low temperature oxide.

3. The EUV lithographic structure of claim 1, wherein the intermediate hardmask layer comprises titanium nitride or an organosilicon.

4. The EUV lithographic structure of claim 1, wherein the intermediate hardmask layer comprises octamethylcyclotetrasiloxane.

* * * * *